United States Patent [19]

Joly

[11] 4,097,822
[45] Jun. 27, 1978

[54] BROAD-BAND CAVITY-TUNED TRANSISTOR OSCILLATOR

[75] Inventor: Robert Joly, Palo Alto, Calif.

[73] Assignee: Hewlett-Packard Company, Palo Alto, Calif.

[21] Appl. No.: 821,005

[22] Filed: Aug. 1, 1977

Related U.S. Application Data

[63] Continuation-in-part of Ser. No. 713,007, Aug. 9, 1976, abandoned.

[51] Int. Cl.² .......................... H03B 5/18; H03B 7/06
[52] U.S. Cl. .................................. 331/101; 331/102; 331/117 D; 333/82 B
[58] Field of Search ............. 331/96, 101, 102, 117 D, 331/117 R; 333/82 B; 330/56

[56] References Cited

U.S. PATENT DOCUMENTS

| | | | |
|---|---|---|---|
| 2,177,272 | 10/1939 | Zottu | 333/82 B X |
| 3,534,294 | 10/1970 | Auer | 331/117 R |
| 3,582,823 | 6/1971 | Pasos | 331/117 D X |
| 3,596,203 | 7/1971 | Sakamoto et al. | 331/96 |
| 3,611,154 | 10/1971 | Kupfer | 331/117 R X |

Primary Examiner—Siegfried H. Grimm
Attorney, Agent, or Firm—Robert S. Hulse

[57] ABSTRACT

A broad-band cavity-tuned transistor oscillator includes a field effect device having capacitive feedback from source to drain and having a gate capacitively coupled to a cavity for producing an output signal that is frequency selectable according to cavity resonance, which resonance is determined by translation position of a mechanical tuning plunger coupled to the cavity and the degree of capacitive feedback.

4 Claims, 14 Drawing Figures

COUPLING ELEMENT IMPEDANCE

BROAD-BAND CAVITY-TUNED TRANSISTOR OSCILLATOR

CROSS-REFERENCE TO PRIOR APPLICATION

This application is a continuation-in-part of my copending U.S. Pat. application Ser. No. 713,007, filed Aug. 9, 1976, now abandoned.

BACKGROUND AND SUMMARY OF THE INVENTION

It is an object of the invention to provide general broad band operation and low noise performance in a cavity-tuned oscillator, as distinct from passive devices such as wavemeters, cavity resonators and mixers to which power is typically applied. Prior solutions to the requirement for broad band/low noise operation have included the use of cavity-tuned klystron oscillators in tube designs having the disadvantages of requiring high voltage power supplies and exhibiting discontinuities when tuned over their operating frequencies due to multi-mode operation. The prior art has also included YIG-tuned oscillators. YIG-tuned oscillators have been desirable in the art because they are electrically tunable and cover broad bands. Tuning is typically accomplished electrically by varying the magnetic field to change the resonant frequency of a YIG sphere typically coupled to an oscillating transistor or negative impedance diode. YIG-tuned oscillators, however, have disadvantages of requiring considerable support circuitry to control tuning, exhibiting high sensitivity to mechanical vibration, generally requiring phase locking to provide stability and low noise performance, and typically producing high harmonics due to means required for coupling signals from the oscillator.

The prior art also includes varactor-tuned oscillators where a variable capacitance diode is coupled to a tank circuit to provide electrical tuning of an oscillator. These have the disadvantages of being narrow in band width when used at microwave frequencies, and typically do not achieve the spectral purity of cavity-tuned oscillators.

Cavity-tuned transistors and negative impedance diode oscillators typically use inductive coupling to a cavity. The inductive coupling characteristically limits band width.

Further problems experienced in the art with reference to broad band oscillator circuit designs include spurious oscillations produced by resonances involving bias circuit elements. Typical solutions include the use of resistors to damp out oscillations, thereby incurring the disadvantages of higher power consumption and lower efficiency.

This invention provides a solution to the requirement of having broad band operation with greater than a 2 to 1 frequency ratio (i.e., a frequency ratio greater than one octave) and low noise performance in a cavity-tuned solid state oscillator. This is accomplished by capacitively coupling to a cavity a two-terminal negative resistance circuit employing capacitive feedback. The capacitive coupling allows multiple substrates to be coupled to the cavity to increase output power and improve the signal to noise output ratio. Additional broad band performance is achieved by varying the capacitive feedback.

DESCRIPTION OF THE PREFERRED EMBODIMENT

Figure 1A:
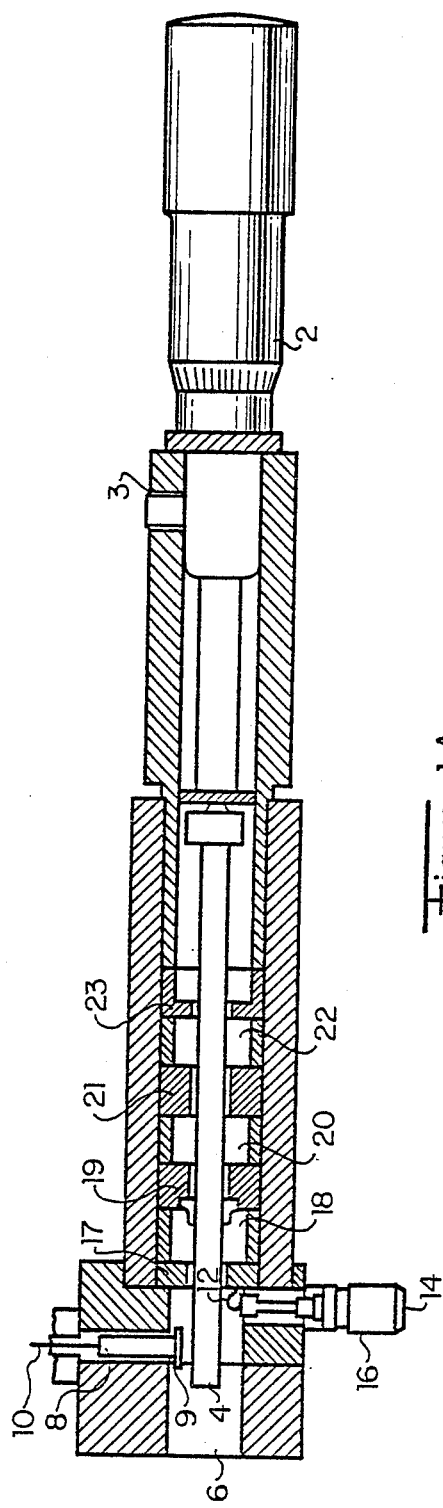
FIGS. 1A and 1B are sectional drawings of a preferred embodiment of the oscillator of the present invention.
Figure 1B:
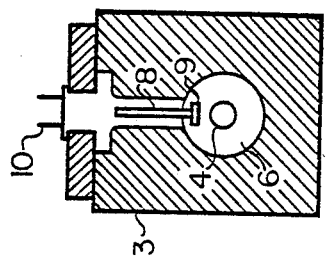

Referring to FIGS. 1A and 1B, there are shown cross-sectional views of a preferred broad band cavity-tuned oscillator. A tuning micrometer 2 is coupled to a metal housing 3 and to a cavity center conductor or tuning plunger 4 that undergoes translational motion into and out of a tuned cavity 6. A substrate assembly 8 having a negative resistance is coupled to the cavity 6 by a coupling element 9. The assembly 8 and coupling element 9 together form a negative resistance means. The cavity 6 resonates at a desired frequency causing a signal to be generated, which signal is picked up by coupling loop 12 and produced as output signal 14 appearing at output connect 16. Low impedance choke ring sections 17, 19, 21, 23 and high impedance choke ring sections 18, 20 and 22 are coupled between the cavity 6 and the tuning micrometer mechanism 2, and disposed in a proximate non-contiguous relationship with center conductor 4 to prevent loss of energy from the cavity 6.

Figure 2A:
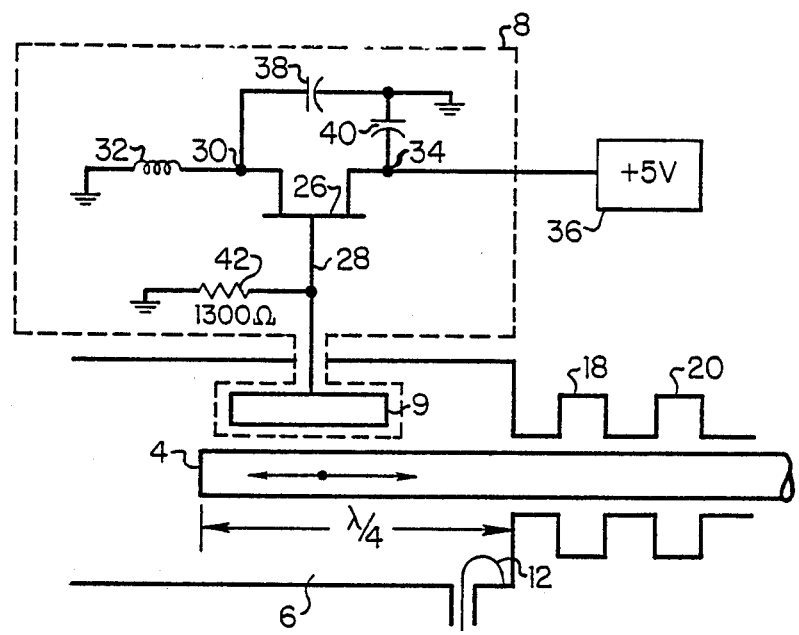
FIGS. 2A and 2B are schematic diagrams of the oscillator of the present invention shown having field effect and bipolar transistor circuits, respectively.

Referring to FIG. 2A, there is shown a schematic diagram of substrate assembly 8 in combination with cavity 6. The assembly 8 includes field effect transistor 26, which has its gate 28 coupled to coupling element 9. The source 30 of the transistor 26 is coupled by means of a choke 32 to ground. The drain contact 34 of the transistor 26 is coupled to a supply source 36 and, by means of decoupling capacitor 40, to ground. A feedback capacitor 38 is coupled between the source 30 and ground, and provides capacitive feedback from the source 30 to the drain 34. Resistance 42 is coupled between ground and the gate 28 to provide proper biasing for the transistor 26.

Figure 3A:
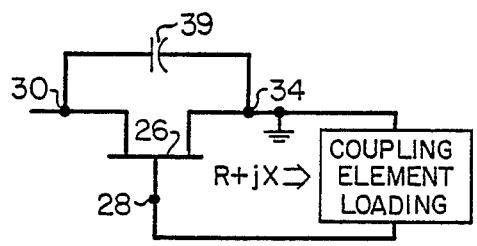
FIGS. 3A–3D illustate an equivalent circuit, a graph of the impedance of the cavity of the oscillator of FIG. 2, and mechanical configurations of the coupling employed between a driving means and the cavity.
Figure 3B:
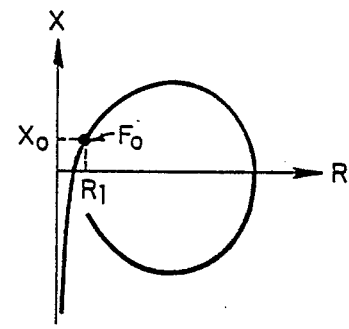
Figure 3C:
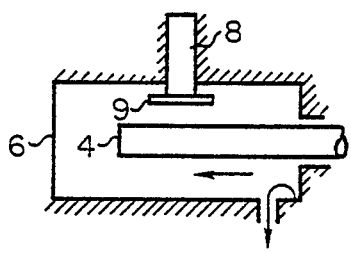
Figure 3D:
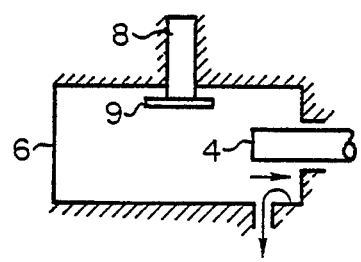
Figure 2B:
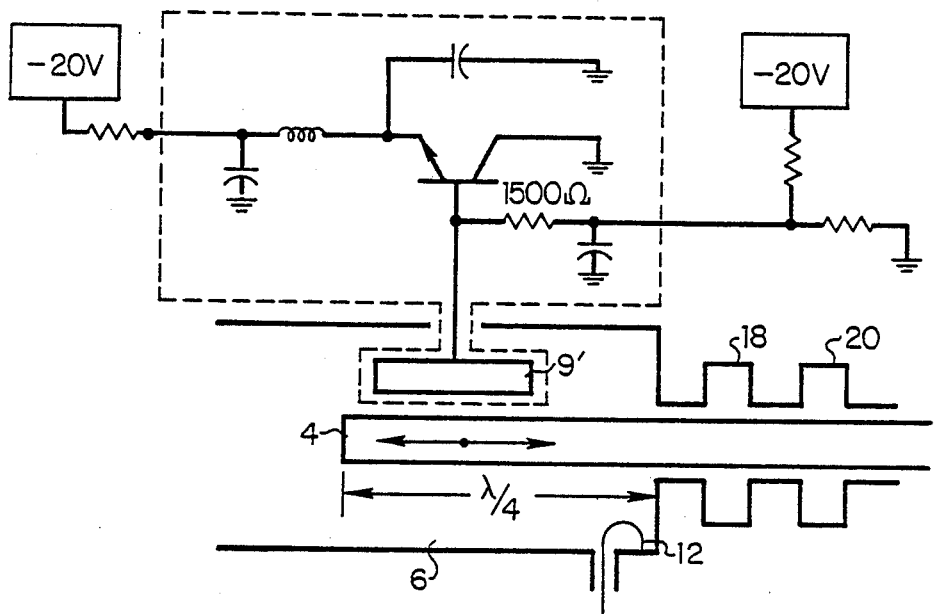

Referring to FIGS. 3A, 3B, 3C and 3D, a simplified equivalent circuit of substrate assembly 8, a graph of the impedance of the cavity 6 at the coupling element 9, and drawings of the physical orientation of substrate assembly 8 relative to the cavity 6, are indicated. In FIG. 3A, capacitor 39 has the equivalent capacitance provided by capacitors 38 and 40 in FIG. 2A. Assume, for example, that feedback capacitor 39 has a capacitance of .25 picofarad at a frequency $F_0$, transistor 26 would present an impedance $-R_0 -jX_0$ to the coupling element 9. The length of the center conductor 4 within the cavity 6 is adjusted so that the impedance of coupling element 9, at frequency $F_0$, is equal to $R_1 + jX$. If $R_1$ is less than $R_0$, oscillation occurs at $F_0$ as shown in FIG. 3B. Referring to FIGS. 3C and 3D, it can be seen that as the resonance frequency of the cavity 6 is changed by virtue of translation of the center conductor 4, the coupled cavity impedance $R + jX$ presented to the transistor 26 changes, since the capacitive reactance between the center conductor 4 and the coupling element 9 changes. To tune the oscillator higher in frequency, for example, the center conductor 4 is moved to the right in a direction out of the cavity 6 as shown in FIG. 3D. The capacitance between the center conductor 4 and the coupling element 9 will thus decrease uniformly as the frequency increases, tending to reduce the variation of the susceptance $\omega C$, which influences the coupled impedance $R + jX$. When the end of the center conductor 4 is positioned to the right of the end of the coupling element 9, as shown in FIG. 3D, the coupled impedance begins to change very quickly, thereby determining the high frequency limit of the oscillator. At the low frequency end, the end of the center conductor 4 can go beyond the left end of the coupling element 9, as shown in FIG. 3C, since the transistor circuit impedance increases, thereby requiring "looser" coupling. Thus, by suitably selecting the length and location of the coupling element 9 in the cavity, the oscillation condition is met over a frequency range corresponding to a ratio greater than 2 to 1.

More particularly, FIGS. 3C and 3D show movable plunger 4 in a cavity 6 of an oscillator, and coupling element 9 and substrate assembly 8 forming a negative resistive means in said cavity. Coupling element 9, which is of uniform shape (e.g., a rectangular shape of selected thickness and length), is disposed within the cavity such that the distance from the leftmost edge of the element to the end of the plunger when the plunger is maximally inserted past the coupling element to a desired lowest frequency position, is substantially equal to the distance from the rightmost edge of the element to the end of the plunger when the plunger is minimally inserted to a desired highest frequency position. Disposed thus within the cavity 6, the coupling element 9 provides for uniformity in variation of capacitance between the coupling element and the plunger as the plunger is moved into and out of the cavity relative to the coupling element, and for the production of a signal having a selected frequency within a frequency range of substantially one octave. The lowest and highest frequency positions being the boundaries or outer limits of the frequency range of substantially one octave.

Figure 4:
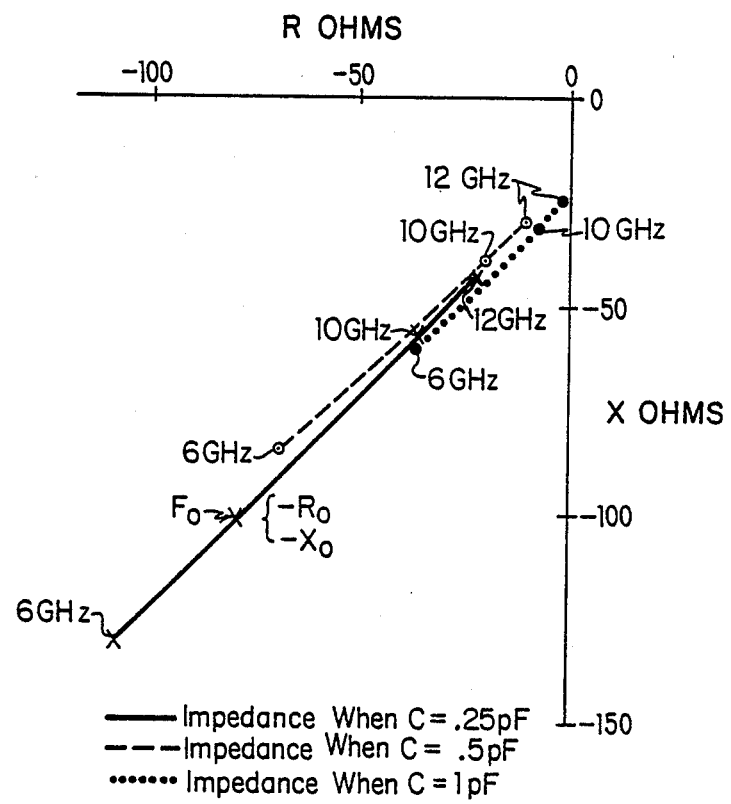
FIG. 4 is a graph showing impedance presented to a coupling element of the oscillator of FIG. 2 by a field effect transistor for different values of feedback capacitance.
Figure 5:
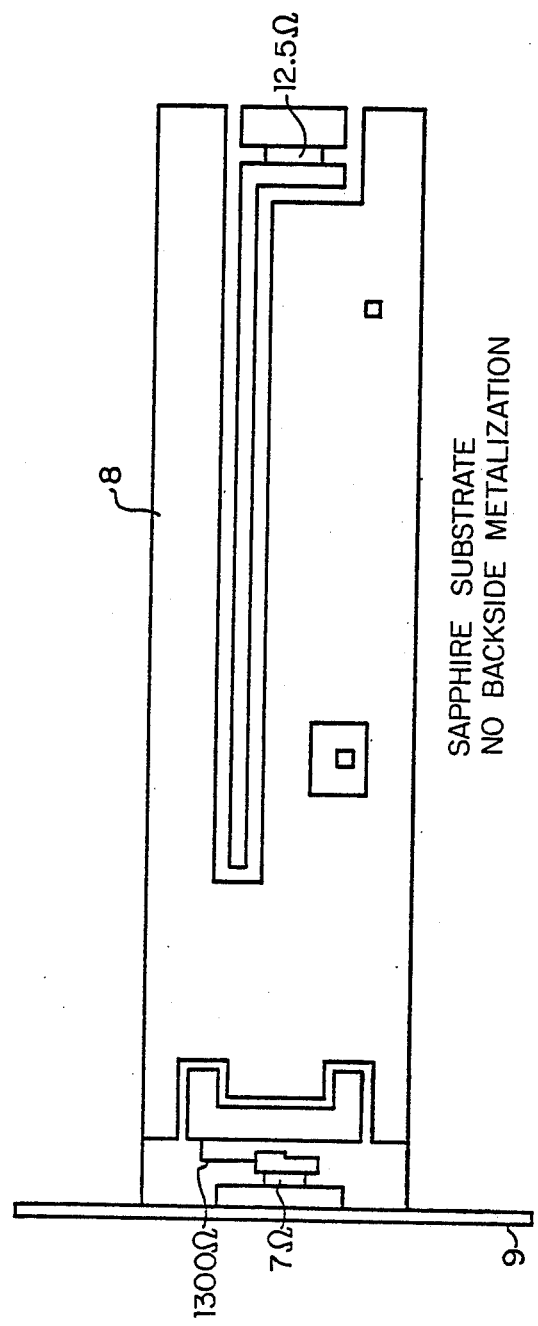
FIG. 5 shows a preferred metallization pattern of a sapphire substrate utilized to construct the oscillator of FIGS. 1A and 1B.
Figure 6:
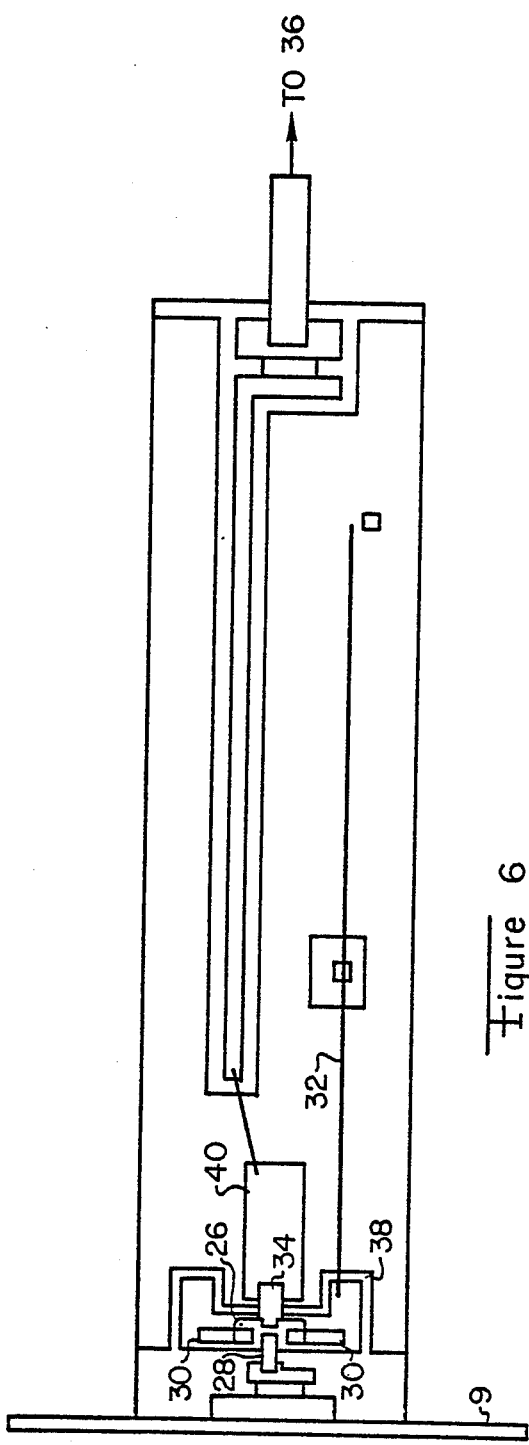
FIG. 6 is a diagram showing a preferred substrate assembly utilized in fabricating the oscillator of FIGS. 1A and 1B.
Figure 7:
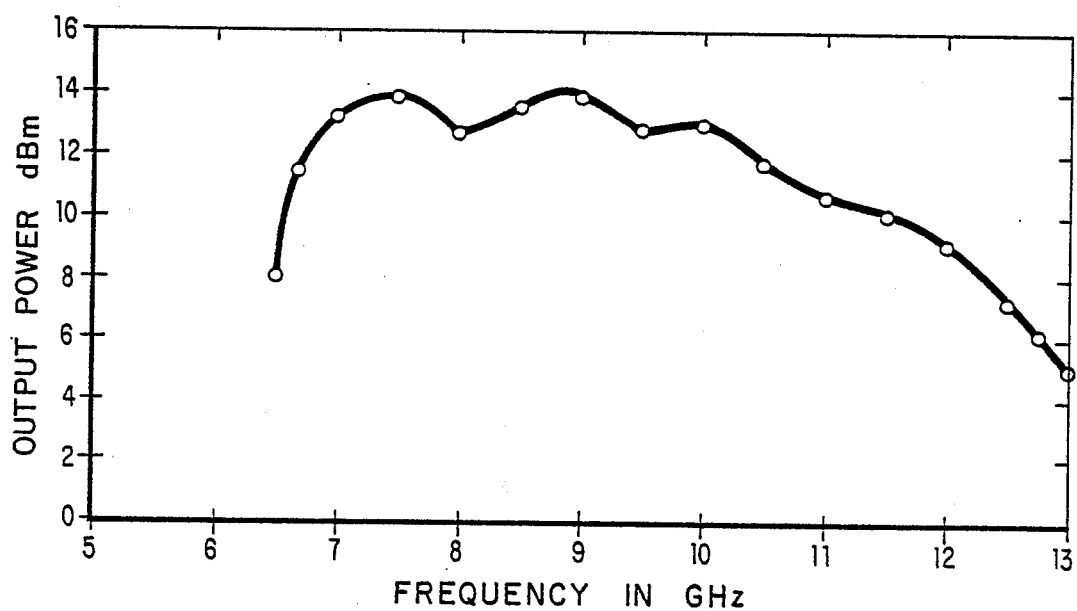
FIG. 7 is a graph showing typical oscillator output versus frequency for an oscillator made in accordance with a preferred embodiment of the invention and utilizing one substrate assembly.

Referring to FIG. 4, there is shown a graph illustrating transistor circuit impedance real part R and imaginary part X at the coupling element 9, at frequencies of from 6GHz to 12GHz for various values (C = 0.25, 0.5 and 1 picofarad) of feedback capacitance 39 (FIG. 3A). Referring to FIGS. 5 and 6, a preferred substrate assembly 8 is shown. Typical broad band performance for an oscillator incorporating this preferred substrate assembly is illustrated in FIG. 7.

Figure 8:
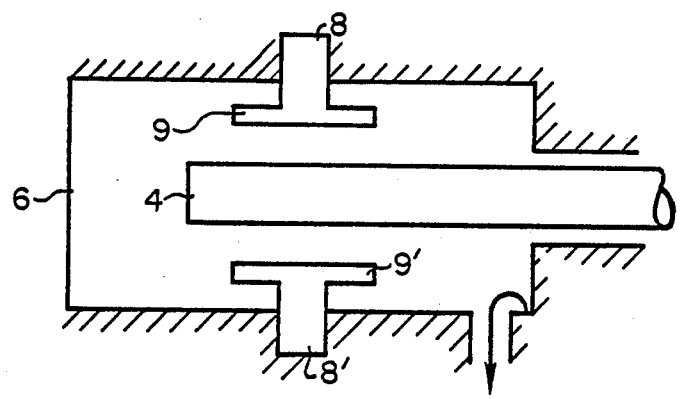
FIG. 8 is a sectional drawing showing an alternative embodiment of the oscillator of the present invention having two substrate assemblies.

The preferred embodiment of the oscillator of the present invention exhibits relatively constant output power over a broad frequency range. The residual harmonics in oscillator output are extremely low. It is possible to place several identical substrate assemblies in a single cavity (e.g., two substrates as shown in FIG. 8), each with its own coupling element 9 in a single-cavity oscillator.

Figure 9:
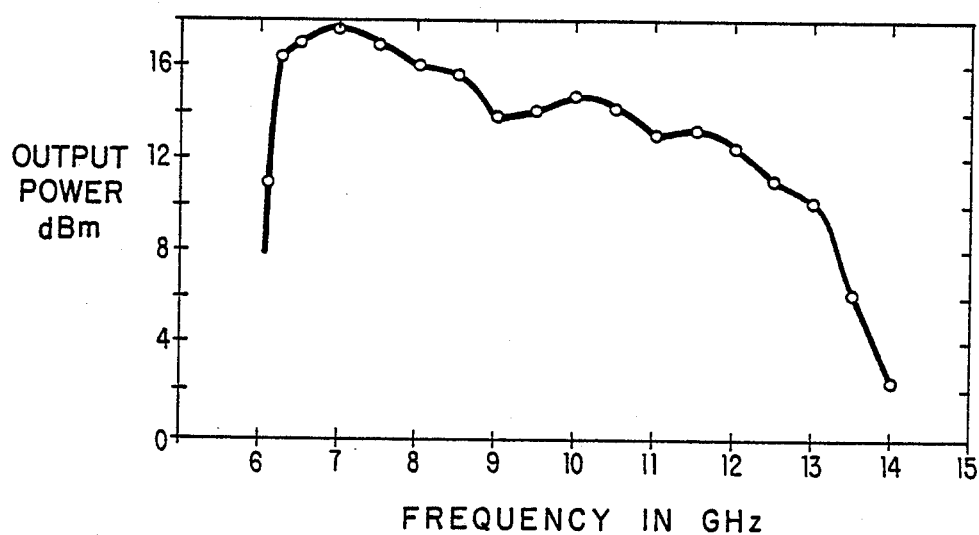
FIG. 9 is a graph of oscillator output versus frequency for an oscillator made in accordance with another preferred embodiment of the invention and having two substrate assemblies.

Thus, a convenient means is provided for increasing output power without using cumbersome power combiners. The tuning range is increased and the spectral purity of the output signal is improved as a consequence of using a plurality of substrate assemblies. The statistical independence of the low frequency noise of each of the plurality of negative resistance devices from the noise of any other of the negative resistance devices improves the output signal to noise ratio of the oscillator. Performance for a two-substrate assembly single-cavity oscillator is depicted in FIG. 9.

Signal processing is obtained over a broad frequency range by capacitively coupling a varactor or signal processing device, or the like to the cavity 6 by a small coupling element 9 using a substrate assembly 8, for example, similar to that discussed above for transistor circuits.

Referring again to FIG. 4, it is shown that the feedback capacitance 39 (FIG. 3A) should preferably be decreased for oscillation at higher frequencies (for example, R = 0 ohms at a 12 gigahertz frequency with capacitance equal to one picofarad) and increased for low frequency oscillations (such as, for example, 6 gigahertz with a capacitance of 0.25 picofarad). Increased band width is achieved by providing for the feedback capacitance 39 to be variable, as, for example, by using a varactor having different capacitance values that can be varied electrically or switched into the circuit as required. This approach to broad band tuning additionally inhibits spurious oscillations.

I claim:

1. An oscillator comprising:
   a cavity structure having a translationally movable tuning plunger disposed therein;
   negative resistive means having a capacitive coupling element disposed within the cavity structure for producing a signal having a selected frequency within a frequency range of substantially one octave, the coupling element having a selected thickness and length and located in the cavity so that the distance between the leftmost edge of the element and the end of the plunger positioned at the low frequency end of the frequency range is substantially equal to the distance between the right-most edge of the element and the end of the plunger positioned at the high frequency end of the frequency range, for providing uniformity in variation of capacitance between the coupling element and the plunger as the plunger is moved; and
   means coupled to the cavity structure for connecting the signal produced therein to an output.

2. An oscillator as in claim 1 wherein the negative resistance means includes:
   a transistor having a first contact connected to the capacitive coupling element and having second and third contacts capacitively coupled to each other; and biasing means coupled to the transistor for causing the transistor to couple energy to the capacitive coupling element.

3. An oscillator as in claim 2 wherein the transistor is a field effect transistor.

4. An oscllator as in claim 2 wherein the transistor is a bipolar transistor.

* * * * *